(12) United States Patent
Matsumura et al.

(10) Patent No.: US 6,987,641 B2
(45) Date of Patent: Jan. 17, 2006

(54) PROTECTION OF ELECTRONIC APPARATUS AGAINST ERRONEOUS OPERATIONS BY STOPPING POWER SUPPLY

(75) Inventors: Hirofumi Matsumura, Kawagoe (JP); Hirokazu Arai, Kawagoe (JP)

(73) Assignee: Pioneer Corporation, Tokyo-To (JP)

( * ) Notice: Subject to any disclaimer, the term of this patent is extended or adjusted under 35 U.S.C. 154(b) by 0 days.

(21) Appl. No.: 10/863,236

(22) Filed: Jun. 9, 2004

(65) Prior Publication Data

US 2004/0223421 A1 Nov. 11, 2004

Related U.S. Application Data

(62) Division of application No. 10/119,117, filed on Apr. 10, 2002.

(30) Foreign Application Priority Data

May 7, 2001 (JP) .......................... P2001-136412
May 7, 2001 (JP) .......................... P2001-136413

(51) Int. Cl.
*G11B 17/08* (2006.01)
(52) U.S. Cl. .................................. 360/98.04; 360/98.05
(58) Field of Classification Search ... 360/98.04–98.06
See application file for complete search history.

(56) References Cited

U.S. PATENT DOCUMENTS

| 4,833,554 A | | 5/1989 | Dalziel et al. |
| 5,590,047 A | * | 12/1996 | Uehara ........................ 700/214 |
| 5,643,001 A | * | 7/1997 | Kaufman et al. ............ 439/159 |
| 5,747,735 A | | 5/1998 | Chang et al. |
| 6,088,222 A | | 7/2000 | Schmitt et al. |
| 6,091,571 A | * | 7/2000 | Hanson .................... 306/98.04 |
| 6,215,666 B1 | | 4/2001 | Hileman et al. |
| 6,262,961 B1 | * | 7/2001 | Maeda et al. ................ 720/628 |

FOREIGN PATENT DOCUMENTS

EP 0 834 880 4/1998

* cited by examiner

*Primary Examiner*—A. J. Heinz
(74) *Attorney, Agent, or Firm*—Morgan, Lewis & Bockius LLP (57) ABSTRACT

An electronic apparatus includes a recording medium container into which a recording medium unit is detachably loaded and that has an insertion inlet through which the recording medium unit is loaded. A cover is detachably attached to the insertion inlet of the recording medium container. A first detector is configured to detect a first state in which the cover is removed from the insertion inlet. A second detector is configured to detect a second state in which the recording medium unit is unloaded from the recording medium container. Stopping means is configured to stop supplying power from a power supply to a load if at least one of the first and second detectors detect at least one of the first and second states.

5 Claims, 7 Drawing Sheets

PROTECTION OF ELECTRONIC APPARATUS AGAINST ERRONEOUS OPERATIONS BY STOPPING POWER SUPPLY

This application is a divisional of Ser. No. 10/119,117 Apr. 10, 2002.

BACKGROUND OF THE INVENTION

1. Technical Field

The present invention relates to an electronic apparatus, and in particular, to an electronic apparatus equipped with a recording medium container into'which a magnetic hard disc, which serves as a magnetic recording medium, is detachably contained.

2. Related Art

Recently, a navigation system, which is an electronic apparatus that can be handled directly by crews, mounted on a car has become popular. A conventional navigation system uses an information recording medium to store map data, which is for instance a CD (Compact Disc)-ROM or a DVD (Digital Video Disc or Digital Versatile Disc)-ROM. A recent trial is that an information recording medium, such a CD-ROM or DVD-ROM, is replaced by an inexpensive, higher-memory-capacity, and rewritable hard disc (i.e., hard disc unit) to store map data therein.

In the case that the hard disc can be mounted, there are many advantages such that map data are easier to be updated because user's individual data as well as map data can be stored due to a large capacity of the memory. On the other hand, a problem concerning static electricity has been pointed out. To be specific, it is frequently required that users have to remove a hard disc (i.e., a hard disc unit; a casing in which a hard disc medium is incorporated) from a navigation system to rewrite its old map data into hew ones. The hard disc unit of which map data have been updated is again loaded into the navigation system. During such unloading and loading operations, static electricity will be to some extent accumulated on the user's body surface. The static electricity is transferred and charged onto the outer surface of the hard disc unit, which may have undesired influence on data stored on the hard disc.

If such charged hard disc unit is loaded, the electric charge on the hard disc unit may create high voltage such hat it is applied to electronic parts mounted on a substrate of the hard disc unit. Due to the application of the high voltage, there is a possibility that the electronic parts are damaged.

In addition, there is a drawback resulted from the fact that the conventional navigation system is provided with no means for preventing erroneous operations to its power supply. Usually, after removing a dressed cover detachably placed at a disc insertion inlet of the navigation system, a user unloads a hard disc unit therefrom to rewrite new map data to its hard disc. The user then loads the hard disc unit into the navigation system, before attaching the dressed cover onto the disc insertion inlet. In the absence of any means for preventing erroneous operations to the power supply of the navigation system, the foregoing unloading and loading operations may cause various problems.

A practical problem may arise when the hard disc unit is loaded or unloaded to or from the navigation system with the navigation system powered. That is, such unloading or loading operations may happen to spoil data written on the hard disc. Moreover, it is pointed out that if the navigation system is powered with no hard disc unit loaded, the system may operate erroneously.

SUMMARY OF THE INVENTION

The present invention has been made with due consideration to the foregoing drawbacks, and a first object of the present invention is to provide an electronic apparatus capable of avoiding a magnetic recording medium from being damaged due to static electricity when the medium is loaded into an objective system.

A second object of the present invention is to provide an electronic apparatus that is able to protect data written on a magnetic recording medium as well as electronic parts from static electricity during unloading or loading the medium from or to an objective system.

A third object of the present invention is to provide an electronic apparatus and a method for controlling power supply, which are able to protect data written on a magnetic recording medium from erroneous procedures in loading the medium into an objective system and to prevent the objective system from operating erroneously.

In order to realize the above objects, as a first aspect, the present invention provides an electronic apparatus comprising: a recording medium container into which a recording medium unit is detachably loaded and in which a guide passage for loading/unloading the recording medium unit is formed; and an earth-contacting member is disposed in the guide passage.

In this configuration, even when a recording medium unit, such as a hard disc unit, charged with static electricity thereon is inserted into a recording medium container, the static electricity can securely be grounded via an earth-contacting member before the recording medium unit is connected to a connector attached in the recording medium container. That is, the static electricity passes directly to the earth, with data stored in a recording medium protected. Additionally, this grounding of the static electricity prevents other electronic parts incorporated in the electronic apparatus from being damaged.

In the above configuration, preferably, the recording medium container is a casing made of conductive material and the earth-contacting member is disposed at a predetermined position around the casing. It is also preferred that the earth-contacting member is a contacting piece formed on the casing, the contacting piece being made to come in contact with an outer surface of the recording medium unit to be loaded. By way of example, the casing has an insertion inlet through which the recording medium unit is inserted and the contacting piece is formed in a vicinity of the insertion inlet. The recording medium unit is, for example, a hard disc unit including a hard disc on which information is magnetically recorded.

As a second aspect, the present invention provides an electronic apparatus comprising: a recording medium container into which a recording medium unit is detachably loaded and that has an insertion inlet through which the recording medium unit is loaded thereinto; a cover detachably attached to the insertion inlet of the recording medium container; a first detector configured to detect a first state in which the cover has removed from the insertion inlet; a second detector configured to detect a second state in which the recording medium unit has unloaded from the recording medium container; and stopping means configured to stop supplying power from a power supply to a load if at least one of the first and second detectors detect at least one of the first and second states.

This configuration makes it possible that, when removal of the cover from the insertion inlet and/or unloading of the recording medium from the container are detected through the first and second detectors, the power from a power supply is forcibly stopped to be supplied. Thus, when the recording medium unit is loaded or unloaded, data stored in its recording medium are protected from erroneous operations and the electronic apparatus is also avoided from being erroneously operated.

In the above configuration, it is preferred that the detectors are disposed in parallel at the insertion inlet. It is also preferred that the cover has a protrusion formed thereon and the first detector is configured to selectively detect either one of a contact to the protrusion and a non-contact from the protrusion. Still preferably, the recording medium has an overhanging member formed on a rear end of the recording medium and the second detector is configured to selectively detect either one of a contact to the overhanging member and a non-contact from the overhanging member.

Still, as a third aspect of the present invention, there is provided a method for controlling power supply in an electronic apparatus comprising a recording medium container into which a recording medium unit is detachably loaded and that has an insertion inlet through which the recording medium unit is loaded thereinto and a cover detachably attached to the insertion inlet of the recording medium container, the method comprising the steps of: first detecting a first state in which the cover has removed from the insertion inlet; second detecting a second state in which the recording medium unit has unloaded from the recording medium container; and stopping supplying power from a power supply to a load if at least one of the first and second states is detected.

Thus, like the foregoing one, when the recording medium unit is loaded or unloaded, data stored in its recording medium are protected from erroneous operations and the electronic apparatus is also avoided from being erroneously operated.

BRIEF DESCRIPTION OF THE DRAWINGS

Other objects and aspects of the present invention will become apparent from the following description and embodiments with reference to the accompanying drawings in which.

DETAILED DESCRIPTION OF PREFERRED EMBODIMENT

Refereeing to the accompanying drawings, a preferred embodiment of the present invention will now be described. The present invention will be described about an on-vehicle navigation system to which an electronic apparatus according to the present invention is applied.

Figure 1:
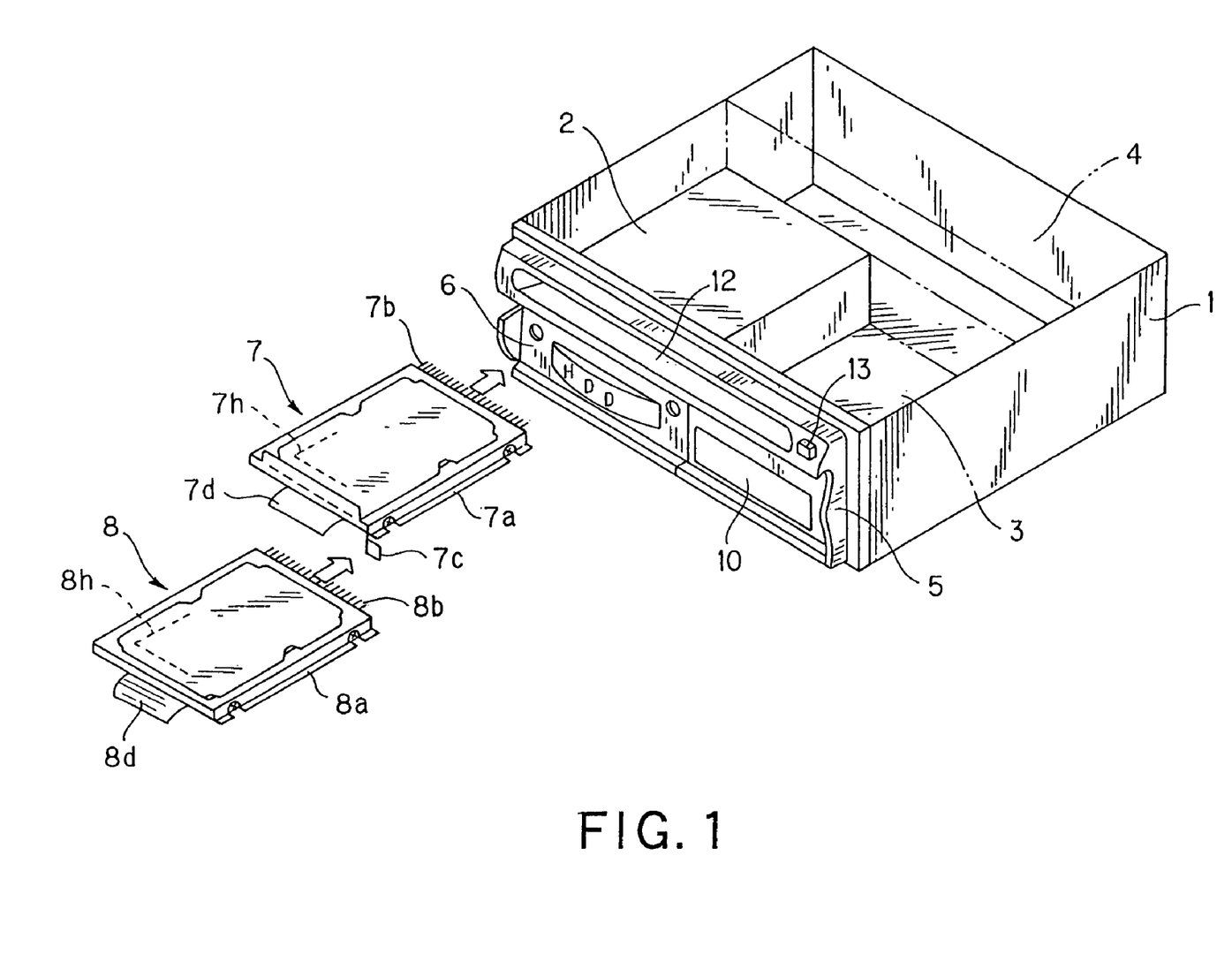
FIG. 1 is a perspective view representing a navigation system to which an example of an electronic apparatus according to the present invention is applied.
Figure 2:
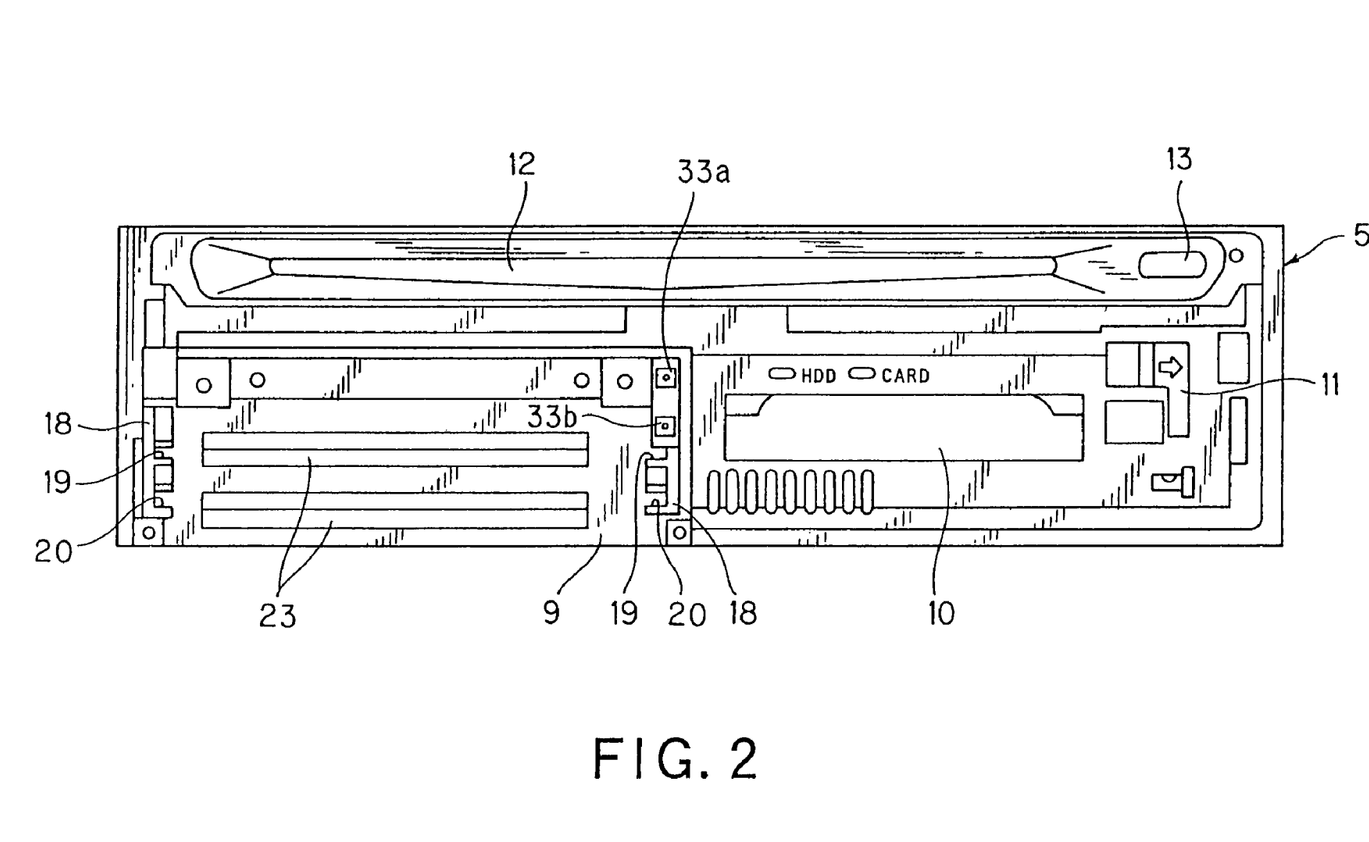
FIG. 2 is a front view of the navigation system.

FIG. 1 shows a navigation system to which one embodiment of an electronic apparatus according to the present invention is applied and FIG. 2 is a front view of the navigation system. The navigation system shown by FIGS. 1 and 2 has a not-shown front cover secured on a front panel thereof, but the navigation system is shown with the front cover removed, the front cover being able to be opened and closed freely.

As shown in FIG. 1, the navigation system includes a rectangular, box-like bottomed frame 1, which is for example incorporated within a recessed portion of the dashboard of a vehicle. In the inner spacing of the frame 1, there is a hard disc container serving as a recording medium container, a PC card container 3, and a substrate/fan container 4. Though not shown, a compact card type of magnetic recording medium (hereafter, referred to as a PC card), which is frequently called memory card, can be inserted into the PC card container 3. This PC card container 3 is positioned next to the hard disc container 2, while the substrate/fan container 4 is positioned at the side of the rears of both the hard disc container 2 and the PC card container 3.

A ROM drive unit (not shown) to drive a CD-ROM or DVD-ROM is mounted above both of the hard disc container 2 and the PC card container 3.

The PC card, which serves as the foregoing card type of recording medium, can be used for storing information at both a home-use personal computer and the navigation system according to the present embodiment. Also, among a plurality of electronic apparatuses, the PC card can be used as a common recording medium to record pieces of information. On the front of the frame 1, a front panel 5 is secured as shown in FIGS. 1 and 2. The front panel 5 can be seen after the front cover is removed. At the lower left of the front panel 5, a dressed cover 6 is disposed. When the dressed cover 6 is removed, a hard disc insertion inlet 9 to load and unload two hard disc units 7 and 8 serving as magnetic recording medium units of the present invention can be seen. The hard disc units 7 and 8 include therein hard discs 7h and 8h, respectively. The hard disc insertion inlet 9 is continuously coupled with the hard disc container 2. In FIG. 2, the navigation system is shown with the two hard disc units 7 and 8 unloaded.

In the configuration shown in FIG. 1, one hard disc unit 7 memorizes various types of data, such as map data and individual music data, while the remaining hard disc unit 8 memorizes data of for example, music information recorded by a user for private use. The front panel 5 is formed to be almost perpendicular to the running direction of the vehicle.

On both the longitudinal sides of each of the hard disc units 7 and 8, as shown in FIG. 1, rod-like slide members 7a (8a) are secured along their sides. In addition, on the front side to be inserted ahead of each hard disc unit 7 (8), pluralities of pins 7b (8b) to be connected with a later-described connector are built. An overhanging piece 7c is fixedly arranged at one side end of the rear of the hard disc unit 7 to extend in its width direction thereof. On the rear of each of the hard disc units 7 and 8, an insulating and flexible handle 7d (8d) made of plastic material is mounted for holding in loading and unloading each hard disc unit 7 (8).

At the frontal lower right of the front panel 5, a card insertion inlet 10 with a cover is formed, through which the not-shown PC card is loaded and unloaded. The cover can be opened when such loading and unloading is needed. The card insertion inlet 10 is continuously led to the PC card container 3. An ejection button 11 is arranged next to the card insertion inlet 10 to eject the PC card.

Further, a ROM insertion inlet 12 is opened at the frontal upper location of the front panel 5 so as to load and unload the CD-ROM or DVD-ROM. The ROM insertion inlet 12 is continuously led to the drive unit to drive the ROM. A further ejection button 13 is placed next to the ROM insertion inlet 12 so that the ROM can be ejected.

Figure 3A:
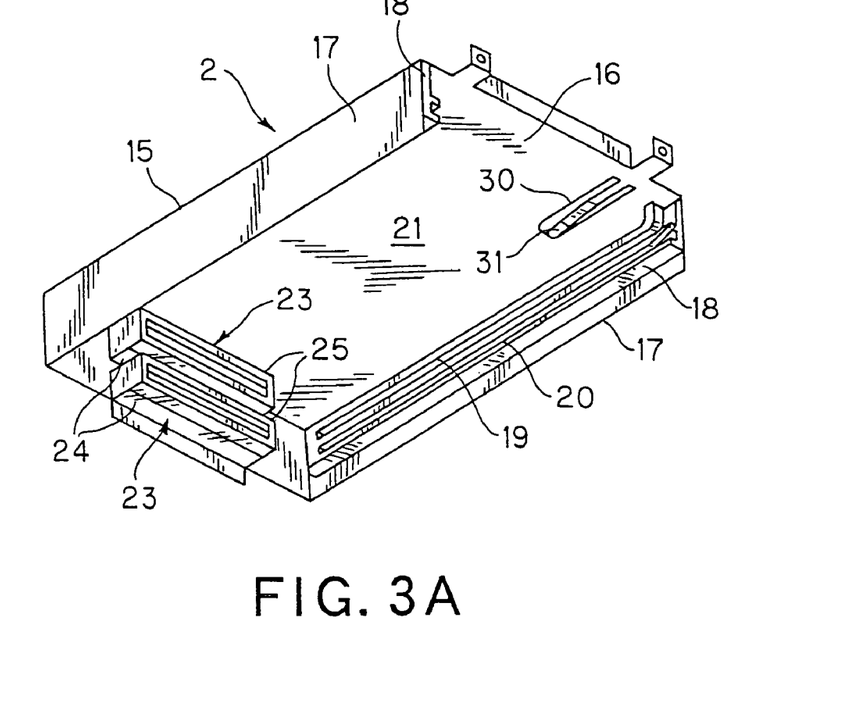
FIG. 3A is a perspective view, viewed upward from under the navigation system, representing a recording medium container disposed in the navigation system.
Figure 3B:
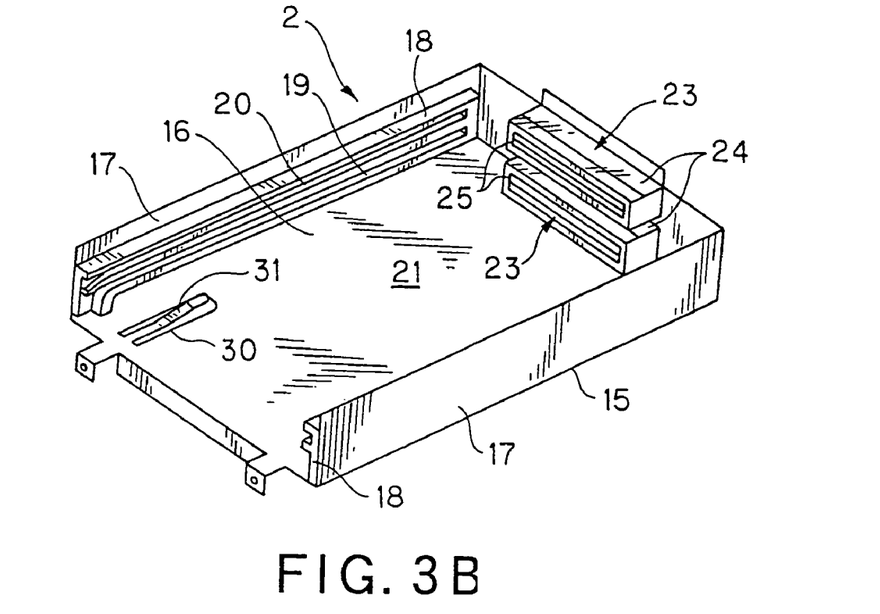
FIG. 3B is another perspective view of the recording medium container, when viewing the recording medium container reversed.

The hard disc container 2 includes a casing 15, as shown in FIGS. 3A and 3B, which serves as a conductive case. The casing 15 is formed by bending a plate-like member, made of a conductive metal material such as stainless steel, into a flat box shape, but no bottom. That is, the casing 15 is structured into one body including a ceiling portion 16 and wall portions 17 built at both ends of the ceiling portion 16.

On the inner side of each of the wall portions 17, a rail member 18 is secured along the longitudinal direction thereof in such a manner that the rail members 18 on both the wall portions 17 are paired face to face. In each of the rail members 18, two upper and lower guide grooves 19 and 20 are formed along the longitudinal direction of each rail member. The foregoing slide members 7a (8a) on both the sides of each hard disc unit 7 (8) can be inserted into the guide grooves 19 (20), and slid therealong with its guide, so that each of the hard disc units 7 and 8 can be loaded and unloaded. Thus, a spacing surrounded by both the pair of rail members 18 and the ceiling portion 16 functions as a loading/unloading passage 21 for the hard disc unit 7.

Moreover, at the hard disc insertion inlet 9, the upper partition constituting the upper guide groove 19 together with its lower partition shown in FIG. 3A is bent in the form of an arc (refer to FIGS. 3A and 3B). Also, at the hard disc insertion inlet 9, the upper partition constituting the lower guide groove 20 together with its lower partition in FIG. 3A is formed to be an oblique shape. Both of the arc form and oblique shape make it easier to insert the slide members 7a and 8a of the hard disc units 7 and 8 into the individual guide grooves 19 and 20.

On the inner rear of the casing 15, a substrate 22 is mounted, and two connectors 23 are secured to lateral upper and lower locations on the substrate 22. Each connector 23 is equipped with a body 24 made of heat-resistance resin and fastened on the substrate 22 and a cover member 25 formed in an approximately M-shaped in section, made of heat-resistance resin, and attached to the body 24 so that the cover member 25 can be swung. When each of the hard disc units 7 and 8 is inserted into the guide grooves 19 (20), the pins 7b (8b) of each hard disc unit 7 (8) are inserted into the cover member 25.

With reference to FIGS. 4 to 7, the structure of each connector 23 will be detailed.

Figure 4:
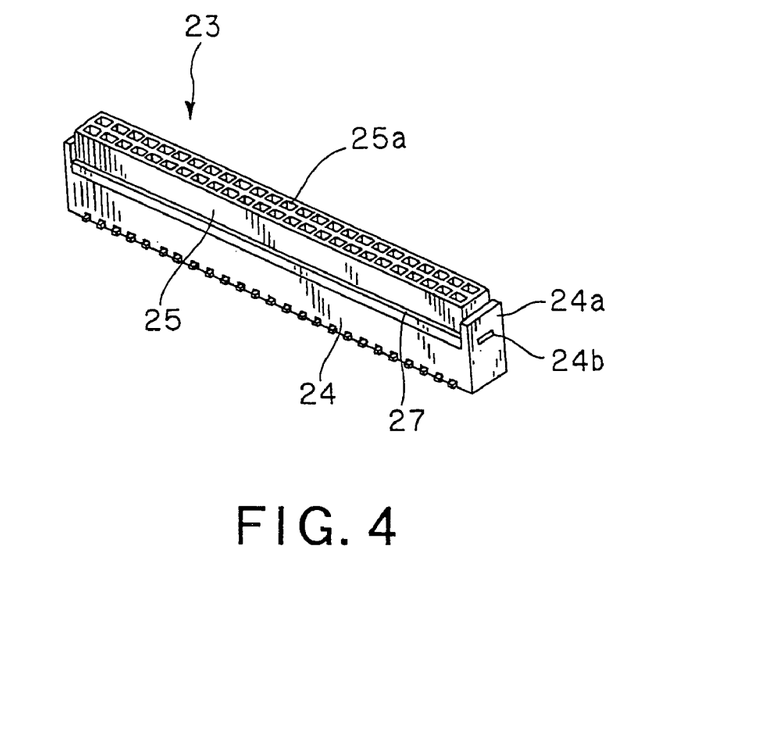
FIG. 4 shows a perspective view of a connector incorporated in the navigation system.
Figure 5:
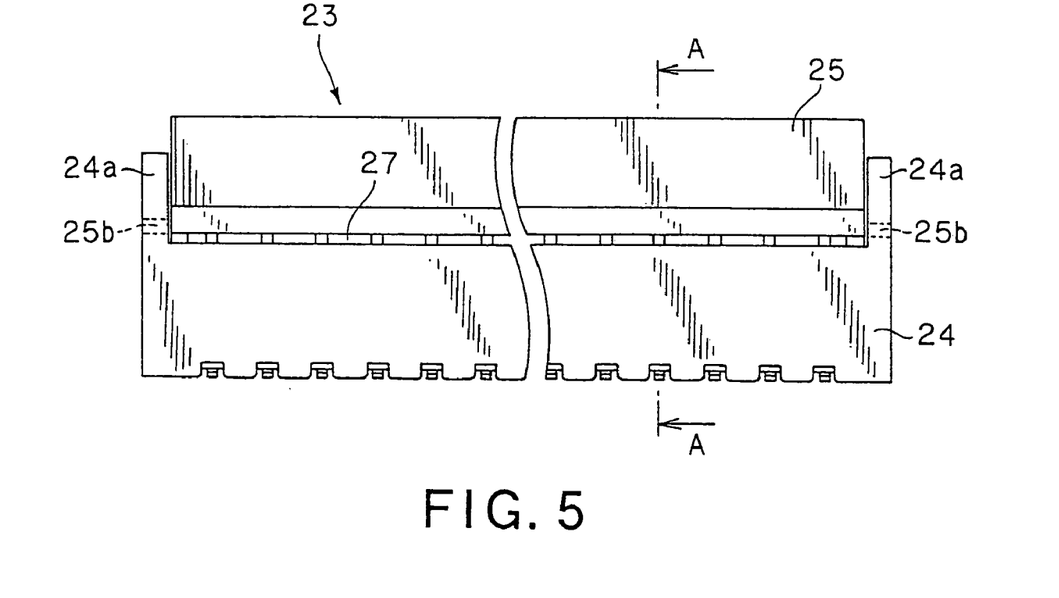
FIG. 5 is an enlarged front view of the connector.
Figure 6:
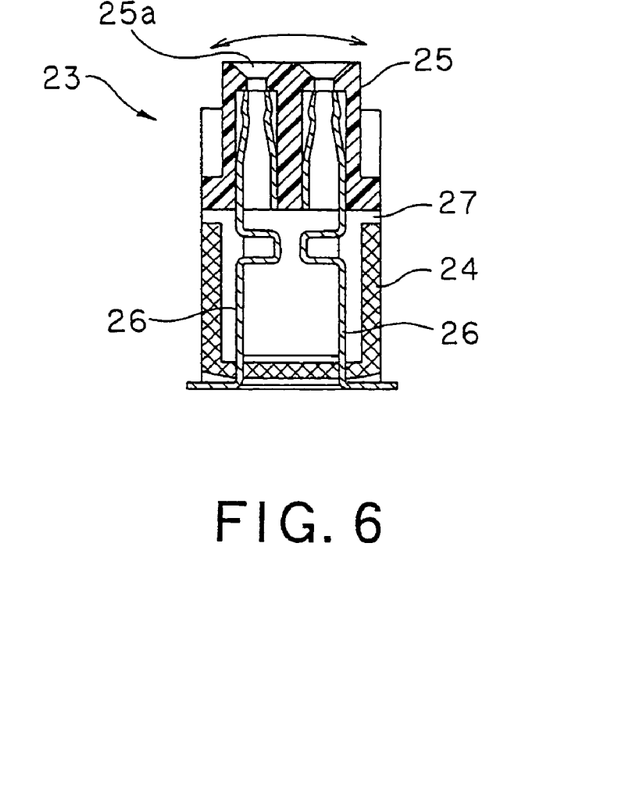
FIG. 6 shows a cross section of the connector, taken along A—A line in FIG. 5.
Figure 7:
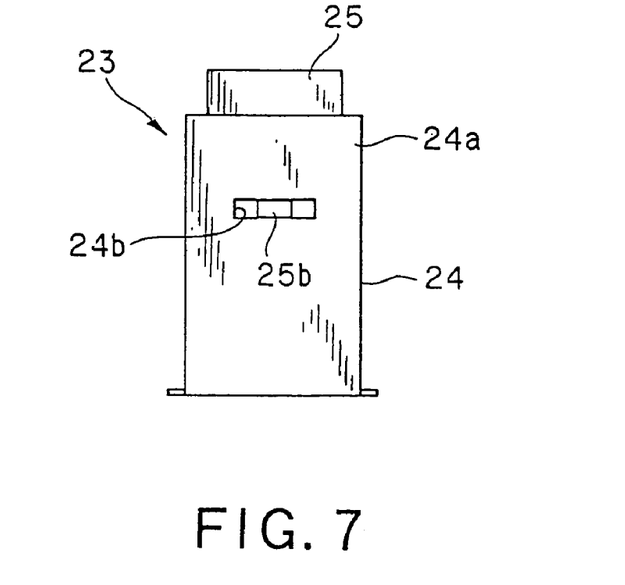
FIG. 7 is a side view of the connector.

As shown in FIGS. 4 to 7, the body 24 of each connector 23 is formed into an approximately U-shape in section and standing-up walls 24a are integrally formed on both sides of the body 24 (refer to FIGS. 4, 5 and 7). Through the root of each standing-up wall 24a, a slit 24b is formed. On the other hand, the cover member 25 of each connector 23 is shaped into an approximately M-form in section, in which a plurality of through holes 25a into which a plurality of pins 7b or 8b are inserted are formed therethrough. At both lower ends of sides of each cover member 25, protrusions 25b are formed to protrude in the longitudinal direction of the cover member 25. Each protrusion 25 is fitted with each slit 24b of the body 24.

As shown in FIG. 6, contact members 26 are placed through both the body 24 and the cover member 25. Each contact member 26 made of a gold-plated copper-based alloy is placed, one by one, toward each through hole 25a of the cover 25. One end of each contact member 26 extends up to almost each through hole 25a, while the other end thereof is taken out from the body 24 to be secured on the substrate by means of soldering. Thus, in cases where the pins 7b and 8b of the hard disc units 7 and 8 are inserted into the through holes 25a of the cover member 25, the pins 7b and 8b realize electrical contacts with the substrate 22 via the contact members 26.

The cover member 25 is mounted to the body 24 with a slight spacing 27 left therebetween, wherein the protrusions 25a of each cover member 25 are fitted to the slits 24b of each body 24 and the plural contact members 26 are placed through both the body 24 and the cover member 25. Hence the cover member 25 is coupled with the body 24 as a single structure, but can be swung in a direction shown by an arrow in FIG. 6.

Figure 8:
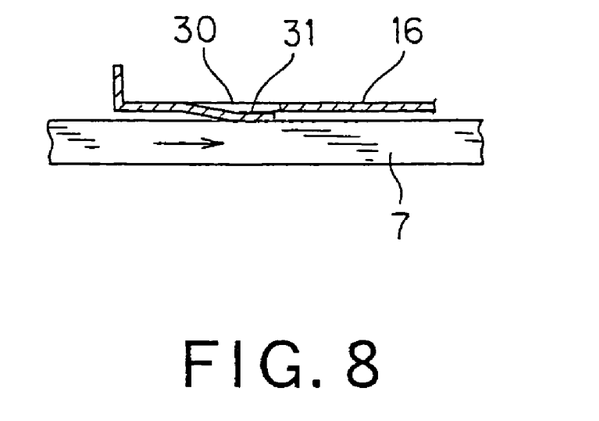
FIG. 8 is a cross section showing a contacting piece formed on a casing of the recording medium container.

As shown in FIGS. 3A and 3B, at a certain location near to the hard disc insertion inlet 9 on the ceiling portion 16 of the casing 15, an approximate U-shaped notch 30 is formed. A contacting piece 31, which serves as a grounding contact member, is formed integrally with the notch 30 such that the contacting piece 31 slightly protrudes downward from the ceiling portion 16. Therefore, as illustrated in FIG. 8, when the hard disc unit 7 is inserted into the guide grooves 19, the contacting piece 31 will come into contact with the upper surface of the hard disc unit 7. This contact permits static electricity charged on the hard disc unit 7 to be grounded via the casing 15 to the frame 1, before the pins 7b of the hard disc unit 7 reach the through holes 25b of the cover member 25.

Figure 9:
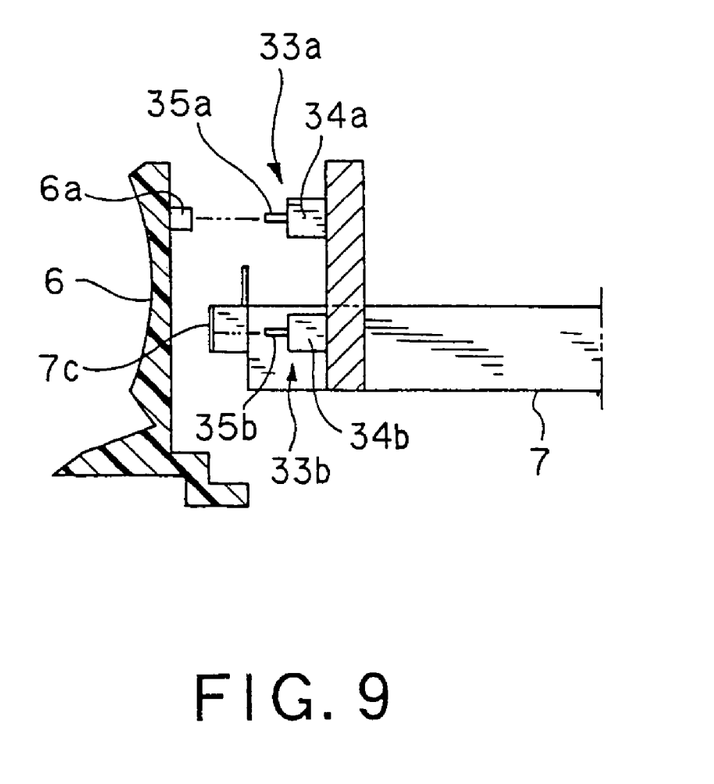
FIG. 9 is an illustration of two switches attached to the vicinity of an opening formed by a hard disc insertion inlet of the navigation system.

Further, as shown in FIG. 2, at predetermined end positions on the edge forming the hard disc insertion inlet 9, two switches 33a and 33b are arranged in line in the up-and-down direction. One switch 33a serves a first detector and the other switch 33b serves a second detector. These switches 33a and 33b have, as shown in FIG. 9, bodies 34a and 34b and operating pins 35a and 0.35b extendably protruding forward from the bodies 34a and 34b, respectively. When each operating pin 35a (35b) is pressed to retract into each body 34a (34b), the switch 33a (33b) is turned on, whereas when each operating pin 35a (35b) is relieved from being pressed, thus being restored to its protruded position, the switch 33a (33b) is turned off.

As shown in FIG. 9, design is made such that when the dressed cover 6 is mounted onto the hard disc insertion inlet 9, a protrusion 6a formed on the rear of the dressed cover 6 pushes the operating pins 35a to retract into its body 34a. Hence, the switch 33a (the first detector) is turned on. In contrast, when the dressed cover 6 is removed, the operating pin 35a becomes protruded from the body 34a, which makes the switch 33a turn off.

In addition, the switch 33b (the second detector) is mounted such that, when the hard disc unit 7 is inserted along the guide grooves 19 and its pins 7b are inserted into the through holes 25a of the cover member 25 of the connector 23, the overhanging piece 7c mounted on the rear of the hard disc unit 7 pushes the operating pin 35b of the switch 33b. This makes the switch 33b turn on. In response to pulling the hard disc unit 7 from the guide grooves 19, the overhanging piece 7c separates from the switch 33b. In response to this separation, the operating pin 35b restores to its protruded position, so that the switch 33b turns off.

As described, one switch 33a is in charge of detecting a contact or non-contact of the protrusion 6a mounted on the dressed cover 6 to the hard disc insertion inlet 9. The other switch 33b is in charge of detecting a contact or non-contact of the overhanging piece 7c mounted on the rear of the hard disc unit 7.

Figure 10:
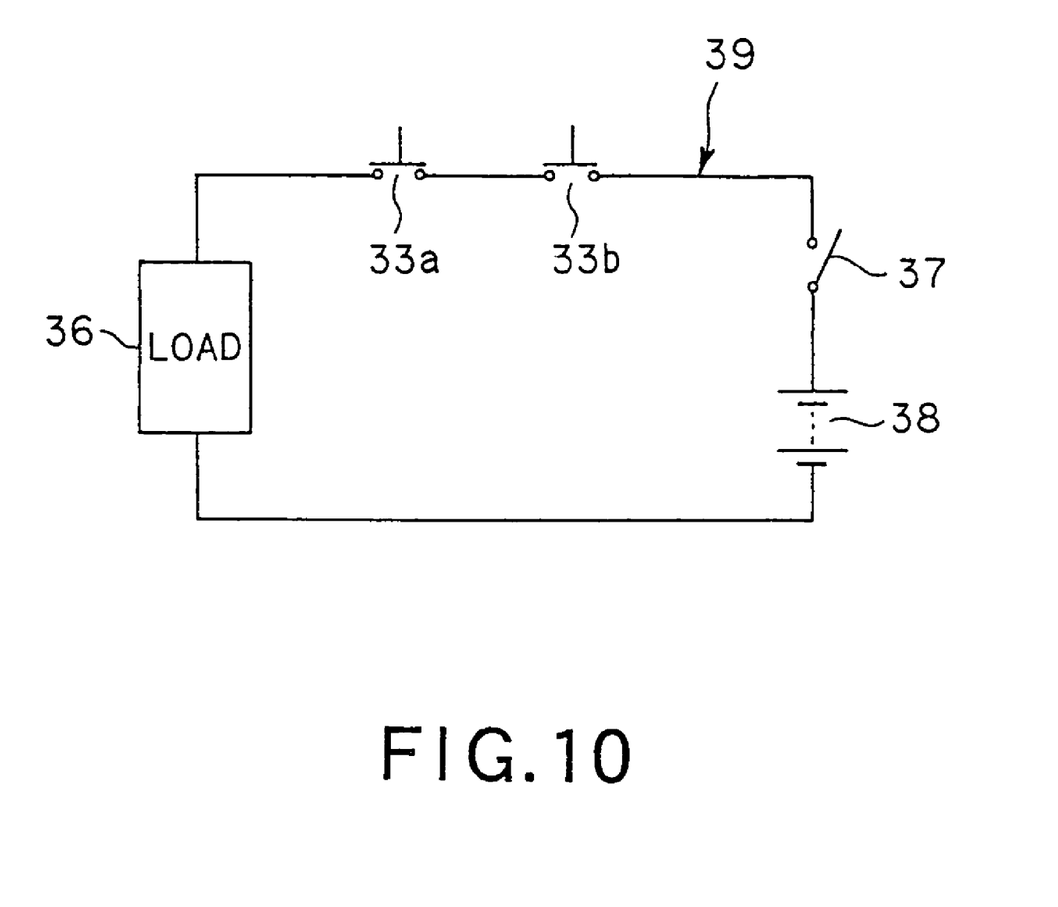
FIG. 10 is a circuit diagram showing a power supply protecting circuit that employs the two switches.

FIG. 10 shows circuitry for protecting the power supply to which both the switches 33a and 33b are electrically connected.

As shown in FIG. 10, the switches 33a and 33b are connected in series to a load 36 consisting of one ore more drive units and connected to a backup power supply 38 via a main switch 37, so that a serially connected loop 39 is formed among the switches 33a, 33b and 37, load 36, and backup power supply 38. This serially connected loop 39 functions as stopping means of the present invention.

In the power supply protecting circuit, as long as any one of the switches 33a and 33b is off, the turn-on of the main switch 37 will not allow the backup power supply 38 to supply power to the load 36. Thus the load 36 will not be activated. The load 36 is not powered by the backup power supply 38 and is not driven, unless both of the switches 33a and 33b become turned on.

The navigation system of this embodiment will now be described in terms of its operations.

It is frequently required that map data stored in the navigation system be rewritten for update. For the update, a user is requested to remove the dressed cover 6, and holds the handle 7d of the hard disc unit 7 contained in the hard disc container 2 so that it is pulled out through the hard disc insertion inlet 9. Then the map data are rewritten for update.

On removing the dressed cover 6, the operating pin 35a of the switch 33a extends outward, thus being turned off. Additionally, on drawing the hard disc unit 7 out from the hard disc insertion inlet 9, the overhanging piece 7c of the hard disc unit 7 separates from the switch 33b, so that its operating pin 35b extends outward to cause the switch 33b to turn off.

The user, who holds the handle 7d of the updated hard disc unit 7, then inserts it into the hard disc container 2 through the hard disc insertion inlet 9. During this insertion, the slide members 7a of the hard disc unit 7 are guided by the guide grooves 19 of the rail members 18 and slid therealong. The hard disc unit 7 slides with its upper surface in contact with the contacting piece 31. Thus, even when static electricity charged on the user is transferred to the hard disc unit 7, the charged static electricity on the hard disc unit 7 is obliged to flow to the frame 1 via the casing 15, before the pins of the hard disc unit 7 are inserted into the through holes 25a of the connector 23. That is, the charged static electricity is grounded directly to the dashboard of the vehicle through the frame 1.

When the pins 7b of the hard disc unit 7 have been inserted into the through holes 25a of the connector 23, the overhanging piece 7c on the rear of the hard disc unit 7 presses the operating pin 35b of the switch 33b, so that the switch 33b is turned on.

Finally, the dressed cover 6 is attached to the hard disc insertion inlet 9 as shown in FIG. 9, the protrusion 6a on the rear of the dressed cover 6 pushes the operating pin 35a of the switch 33a. This causes the switch 33a to turn on. Therefore, whenever the main switch is turned on after the turn-on of both the switches 33a and 33b, the backup power supply 38 is finally allowed to supply power to the load 36.

This makes it possible to actuate the various drive units incorporated in the navigation system.

In this embodiment, the switches 33a and 33b are mutually connected in series, so that the backup power supply 38 is prohibited to supply power to the load 36 until the turn-on of both the switches is realized. The reason for the serial connection is as follows. For example, in cases where the switch 33a is disposed alone, only attaching the dressed cover 6 to the hard disc insertion inlet 9 allows the backup power supply 38 to operate to supply power to the load 36, even if the hard disc unit 7 has not been inserted in the hard disc container 2 yet. This gives rise to an inconvenience that the drive units operate without the hard disc unit 7. On the other hand, the arrangement of only the switch 33b will cause an undesirable situation under which the power supply from the backup power supply 38 to the loads 36 are still kept, even though the dressed cover 6 has already been removed. In the present embodiment, the foregoing inconveniences can be avoided by arranging the two switches mutually connected in series.

The present invention is not restricted to the foregoing embodiment, but can be reduced into practice in other various modifications. For example, the foregoing embodiment has adopted the contacting piece 31 (functioning as an earth-contacting member) arranged on the ceiling portion of the casing 15, but near to the hard disc insertion inlet 9. The contacting piece 31 is not limited to be arranged in such a position. As long as the contacting piece 31 can be grounded to the frame 1, it can be arranged at any position, such as a position in the loading/unloading passage 21 for the hard disc unit 7. Alternatively, the earth-contacting member is not always restricted to the shape of a claw, but may be formed as a linearly shaped piece.

Further, the earth-contacting member according to the present invention may be arranged for the hard disc unit 8, not limited to the configuration for the hard disc unit 7 described in the foregoing embodiment. Specifically, such earth-contacting member may be arranged in the loading/unloading passage 21 through which the hard disc unit 8 is inserted or ejected, so that, even when the hard disc unit 8 is loaded into the hard disc container 2 by an operator who is charged with static electricity, static electricity charged on the hard disc unit 8 is grounded through the earth-contacting member before the pins 8b of the hard disc unit 8 have inserted into the through holes 25a of the connector 23.

Another modification is concerned with the arrangement of the switches 33a and 33b. Although the forgoing embodiment has adopted the two switches 33a and 33b placed at the hard disc insertion inlet 9 in parallel in the up-and-down direction, they can be placed in the loading/unloading passage 21 that allows the hard disc unit 7 to be inserted or ejected. This mounting allows the switches 33a and 33b to turn on when the hard disc container 2 is loaded with the hard disc unit 7.

There is still provided another modification about the number of hard discs to be contained in the hard disc container 2. The foregoing embodiment has been described about the two hard disc units 7 and 8 that can be loaded into the hard disc container 2. Only one hard disc unit, that is, the hard disc unit 7 assigned to storage of map data and private-use music information data may be loaded into the hard disc container 2. Alternatively, if necessary, design to contain three or more hard disc units is also possible.

Accordingly, the electronic apparatus described in the foregoing embodiment and its modifications is able to have various advantages. First, the contacting piece 31 serving as the earth-contacting member is disposed in the loading/ unloading passage 21 for the hard disc unit 7. Hence, even when the hard disc container 2 is loaded with the hard disc unit 7 charged thereon with static electricity due to being handled by a crew who is charged with the static electricity, the static electricity charged on the hard disc unit 7 is securely grounded through the contacting piece 31 before the hard disc unit 7 is coupled with the connector 23. The data themselves stored in the hard disc unit 7 can be protected from the static electricity. In addition, other electronic parts can be avoided from receiving high voltage resulting from sparks caused by the static electricity.

Since map data required for the navigation system is previously stored in the hard disc unit 7, the map data can be protected from being damaged by the static electricity. Additionally, when updating the map data of the hard disc unit 7, unloading and loading the hard disc unit 7 from and into the hard disc container 2 can be done with no electric influence on the main electric circuit of the system.

The contacting piece 31 is designed to be disposed on the casing to contain the hard disc unit 7. It is therefore possible to make the disposal of the contacting piece 31 easier in its manufacture. Still, the contacting piece 31 formed on the casing 15 comes into contact with the outer surface of the hard disc unit 7 inserted into the container 2.

This also makes it possible that the static electricity charged on the hard disc unit 7 via the contacting piece 31 is grounded in an easier and securer manner prior to the connection of the hard disc unit 7 to the connector 23.

Furthermore, the contacting piece 31 is disposed nearer to the hard disc insertion inlet 9 on the casing 15. This makes it longer a distance (i.e., time) to allow the contacting piece 31 to contact the hard disc unit 7 during the insertion of the hard disc unit 7. Grounding the hard disc unit 7 can therefore be steadier.

The insulating-material-made handles 7d and 8d that a user is able to grasp for insertion and ejection of the hard disc units 7 and 8 are attached to the hard disc units 7 and 8, respectively. Thus, even when a user who is charged with static electricity handles the hard disc units 7 and 8, the handles 7d and 8d are reluctant to an easier transfer of the static electricity from the user to the hard disc units 7 and 8.

Each of the connectors 23 is made into one unit by fitting the cover 25 to the body 24 with the slight spacing 27 left therebetween and with the contact member 26 made to intervene therebetween, so that the cover 25 can be swung against the body 24. Therefore, if the pins 7b (8b) of the hard disc unit 7 (8) are positionally deviated to some extent from the through holes 25a of the connector 23 when the hard disc unit 7 (8) is inserted, the deviation can be absorbed by swings of the cover. Thus the hard disc unit 7 (8) can be inserted into the connector 23 with ease, facilitating user's operations necessary for such insertion.

On the other hand, in the foregoing embodiment, removing the dressed cover 6 from the hard disc insertion inlet 9 is detected by one switch 33a and unloading the hard disc unit 7 from the hard disc container 2 is detected by the other switch 33b. When at least one of the switches 33a and 33b is turned on, the backup power supply 38 is forcibly stopped to supply the power. Accordingly, if the hard disc unit 7 is inserted in a mistaken operation order, the electronic influence on the main circuit of the system can be avoided by the above automatic stop of the power supply. It is therefore possible to protect data stored in the hard disc unit 7 during the insertion and ejection thereof and erroneous operations toward the navigation system can be prevented steadily.

In addition, the switches 33a and 33b are disposed in parallel at the hard disc insertion inlet 9, so that they can be attached in an easier manner when being manufactured.

Further, of the two switches 33a and 33b, one is disposed to detect contacts to the protrusion 6a formed on the dressed cover 6 and the other is disposed to detect contacts to the overhanging piece 7c at the rear of the hard disc unit 7. This disposal makes it possible to raise accuracy of the detection of the switches 33a and 33b.

The present invention may be embodied in other specific forms without departing from the spirit or essential characteristics thereof. The present embodiments are therefore to be considered in all respects as illustrative and not restrictive, the scope of the present invention being indicated by the appended claims rather than by the foregoing description and all changes which come within the meaning and range of equivalency of the claims are therefore intended to be embraced therein.

The entire disclosure of two Japanese Patent Application Nos. 2001-136412 and 2001-136413 both filed on May 7, 2001 including the specification, claims, drawings and summary is incorporated herein by reference in its entirety.

What is claimed is:

1. An electronic apparatus in which a power supply powers electric loads including an electric load concerning drive of a recording medium unit, the apparatus comprising:
   a recording medium container into which the recording medium unit is detachably loaded and which has an insertion inlet through which the recording medium unit is loaded and unloaded;
   a cover detachably attached to the recording medium container to cover the insertion inlet;
   a first detector placed to detect a first state in which the cover has been removed from the insertion inlet;
   a second detector placed to detect a second state in which the recording medium unit has unloaded from the recording medium container; and
   stopping means configured to stop supplying power from the power supply to the load when at least one of the first and second detectors detect at least one of the first and second states.

2. The electronic apparatus of claim 1, wherein both of the first and second detectors are disposed in parallel at the insertion inlet.

3. The electronic apparatus of claim 1, wherein the cover has a protrusion formed thereon and the first detector is configured to selectively detect either one of a contact to the protrusion and a non-contact from the protrusion.

4. The electronic apparatus of claim 1, wherein the recording medium unit has an overhanging member formed on a rear end of the recording medium unit and the second detector is configured to selectively detect either one of a contact to the overhanging member and a non-contact from the overhanging member.

5. A method of controlling power supply in an electronic apparatus in which a power supply powers electric loads including an electric load concerning drive of a recording medium unit detachably loaded into a recording medium container having an insertion inlet through which the recording medium unit is loaded and unloaded, a cover being detachably attached to the insertion inlet of the recording medium container, the method comprising steps of:
   first detecting a first state in which the cover has been removed from the insertion inlet;
   second detecting a second state in which the recording medium unit has unloaded from the recording medium container; and
   stopping supplying power from the power supply to the loads when at least one of the first and second states is detected.

* * * * *